United States Patent [19]

Wakely et al.

[11] Patent Number: 4,572,924
[45] Date of Patent: Feb. 25, 1986

[54] ELECTRONIC ENCLOSURES HAVING METAL PARTS

[75] Inventors: Wilbur T. Wakely; Philip R. Scott, both of San Diego, Calif.

[73] Assignee: Spectrum Ceramics, Inc., San Diego, Calif.

[21] Appl. No.: 495,742

[22] Filed: May 18, 1983

[51] Int. Cl.⁴ .............................................. H01L 23/10
[52] U.S. Cl. ................................. 174/52 FP; 357/74; 428/433
[58] Field of Search ........ 174/52 FP, 50.61, 152 GM; 357/74; 501/75, 76; 428/433

[56] References Cited

U.S. PATENT DOCUMENTS

| | | | |
|---|---|---|---|
| 3,320,353 | 5/1967 | Smith | 174/50.61 X |
| 3,337,678 | 8/1967 | Stelmak | 174/52 FP |
| 3,381,080 | 4/1968 | Stelmak | 174/52 FP |
| 3,522,489 | 8/1970 | Sparrow et al. | 174/50.61 X |
| 3,634,600 | 1/1972 | Griffin | 174/52 S |
| 3,729,820 | 5/1973 | Ihochi . | |
| 3,778,242 | 12/1973 | Francel et al. | 501/76 X |
| 3,809,797 | 5/1974 | McMunn et al. | 174/52 S |
| 3,823,468 | 7/1974 | Hascoe | 29/588 |
| 3,871,018 | 3/1975 | Jackson et al. | 174/52 FP X |
| 3,874,549 | 4/1975 | Hascoe | 220/200 |
| 3,916,434 | 10/1975 | Garboushian | 357/74 |
| 4,025,716 | 5/1977 | Morse | 174/52 FP |
| 4,159,358 | 6/1979 | Hench et al. | 428/433 X |
| 4,291,815 | 9/1981 | Gordon et al. | 220/200 |
| 4,331,253 | 5/1982 | Gordon et al. | 220/200 |

Primary Examiner—A. T. Grimley
Assistant Examiner—D. A. Tone
Attorney, Agent, or Firm—Paul R. Wylie

[57] ABSTRACT

A hermetically sealable enclosure for an electronic device. Layers of solder glass bond the lead frame to the enclosure base and to a metallic seal ring. The base and ring can be coated with thin layers of aluminum to promote bonding. The surfaces of the base and ring can be roughened to promote bonding.

10 Claims, 4 Drawing Figures

ELECTRONIC ENCLOSURES HAVING METAL PARTS

BACKGROUND OF THE INVENTION

Metal seal rings are currently used on some electronic device packages which utilize brazing as the method of attaching the seal ring to the ceramic base. Since the brazing is done at temperatures in excess of the melting point of aluminum, any coating of the bonding pads with aluminum must be done after the package is assembled. The metal sealing ring must also be plated after assembly which can result in plating salt residue being left on the package surfaces or crevices.

According to this invention, electronic device packages can be constructed from alumina ceramics and metal leadframes which are sealed together with a low temperature solder glass to form a hermetic seal. This low temperature processing allows the use of aluminum bonding fingers which cannot be done with packages processed at temperatures above the melting point of aluminum. Final sealing is normally accomplished according to the invention by sealing a ceramic lid onto the subassembly using the same solder glass at temperatures which are not detrimental to the electronic device.

SUMMARY

This invention relates to improvements in hermetically sealable enclosures for electronic devices, e.g., integrated circuit.

In one aspect of the invention there is provided a hermetically sealable enclosure for such devices which includes a metallic ring adapted to have a cover for said enclosure installed thereon. A leadframe is bonded to a base member and a metallic ring is bonded to the leadframe by layers of solder glass. The provision of special roughened surfaces between the metallic ring and/or the base member and the solder glass bonding layers are part of the techniques of the invention, as is the use of thin layers of aluminum to promote adherence of the solder glass to the metallic ring and metallic base respectively.

According to a method aspect of this invention there is provided a technique for fabricating a hermetically sealable enclosure for an electronic device such as an integrated circuit, which includes the solder glass bonding of a leadframe to a base member which may be of either ceramic or metal material, and the subsequent bonding of a metallic ring by another layer of solder glass to the leadframe. Features of the method aspects of the invention include roughening techniques for facilitating the bonding of the metallic ring and the leadframe and application techniques for applying thin layers of aluminum to promote bonding.

It is an object of the invention to provide a hermetically sealable enclosure and a method for making such enclosure which will allow low temperature assembly.

A further object of this invention is to provide a durable and inexpensive hermetically sealable enclosure for electronic devices.

A still further object of the invention is the provision of a hermetically sealable enclosure with a metal ring and other parts that can be preplated prior to package assembly so that no plating residues are left on the other package surfaces.

A further object of the invention is the provision of a hermetically sealable enclosure in which the lid can be attached by seam welding or brazing.

In attempting to provide a product and method to meet the objects of this invention, there has been developed the hermetically sealable electronic enclosure, and techniques for its manufacture, described and claimed herein.

PRIOR ART

Various U.S. patents have addressed the problem of hermetically sealing enclosures for electronic components. These include U.S. Pat. Nos. 3,634,600; 3,729,820; 3,809,797; 3,823,468; 3,874,549; 3,916,434; 4,025,716; 4,291,815; and 4,331,253. However, none of these patents have suggested the novel hermetically sealable enclosure, or the method for making such enclosure, of the present invention.

BRIEF DESCRIPTION OF THE INVENTION

According to the invention there is provided a hermetically sealable enclosure for an electronic device such as, for example, an integrated circuit, comprising a base member that has an area on its upper surface adapted to hold such device. A first layer of solder glass, on the upper surface of the base member on a margin around the area adapted to hold the electronic device, holds a leadframe in bonded relation to the base member. A second layer of solder glass on the upper surface of the leadframe holds a metallic ring in bonded relation thereto. The bottom surface of the metallic ring is adapted to adhere to the second layer of solder glass by means to be described hereinafter. In a preferred form of the invention a thin layer of aluminum is applied between the metallic ring and base member respectively and the solder glass layers.

In the method according to the invention a hermetically sealable enclosure is assembled by bonding a leadframe to a base member by means of the solder glass layer and then bonding a metallic ring to the leadframe, again by means of a solder glass layer. Features of the method include the steps of roughening either or both of the metallic ring or base member surfaces to be bonded by the solder glass prior to assembly, and the utilization of relatively thin aluminum layers between the base member and metallic ring respectively and the solder glass layers.

DESCRIPTION OF THE DRAWINGS

The invention will be more fully understood by referring to the accompanying drawing wherein.

DETAILED DESCRIPTION OF THE INVENTION

Figure 2:
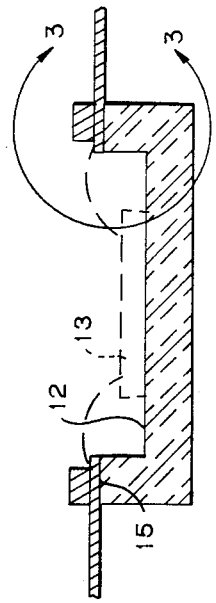
FIG. 2 is a cross-section view taken on line 2—2 of FIG. 1.

With reference to the drawing generally described above, the following is a detailed description to the invention.

According to the invention there is provided a hermetically sealable enclosure 10. The enclosure comprises a base member 11 with the base member having an area 12 thereon adapted to hold an electronic device which in a preferred form of the invention can be, for example, an integrated circuit as shown in dotted lines as element 13. In one form of the invention, a first layer of solder glass 14 is applied on the upper surface 15 of base member 11 on a margin around area 12. A leadframe 16 having a plurality of leads 17 is positioned on base member 11 and bonded thereto by solder glass layer 14. Leadframe 16 can include a removable tie-bar (not shown) to hold together the ends of the leads during assembly. A second layer of solder glass 18 is provided on top of leadframe 16 to form a bond with metallic ring 19.

In another form of the invention, metallic ring 19 may have a bottom surface 10 that is roughened or abraided in some manner so as to enhance the bonding of said metallic ring to said solder glass. The bottom surface 20 of metallic ring 19 can be roughened in a manner suitable to provide a geometrical configured pattern formed into the metal by any means to provide mechanical "locks" with the solder glass layer 18.

In a still further form of the invention, the upper surface 15 of base member 11 can be roughened in a manner similar to the lower surface 20 of metallic ring 19 to provide enhanced bonding with solder glass layer 14.

In another form of the invention, thin layers of aluminum 21 and 22 can be provided between the upper surface 15 of base member 11 and first layer of solder glass 14 as well as between the lower surface 20 of metallic ring 19 and second solder glass layer 18.

Alternate forms of the invention include various combinations of roughened surfaces of metallic ring 19 and the upper surface of base member 11 and aluminum layers 21 and 22. For example, a single layer of aluminum 21 or 22 can be used with or without roughened surfaces 20 and 15, and conversely the roughening of surfaces 20 and 15 can be used with or without either or both aluminum layers 21 and 22. However, optimum strength of the package has been found to exist with both surfaces 15 and 20 roughened in accordance with the invention and with both aluminum layers 21 and 22 in place.

In a further form of the invention, metallic ring 19 can include a gold plating 23 on all surfaces thereof other than bottom surface 20.

Figure 4:
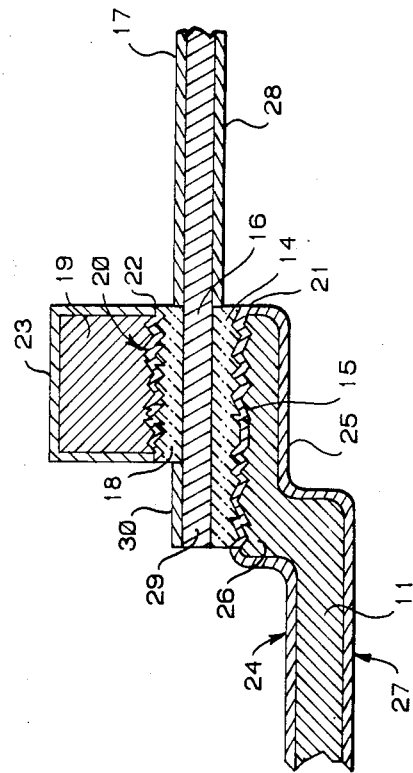
FIG. 4 is a view similar to FIG. 3 showing an alternate embodiment of the invention.
Figure 1:
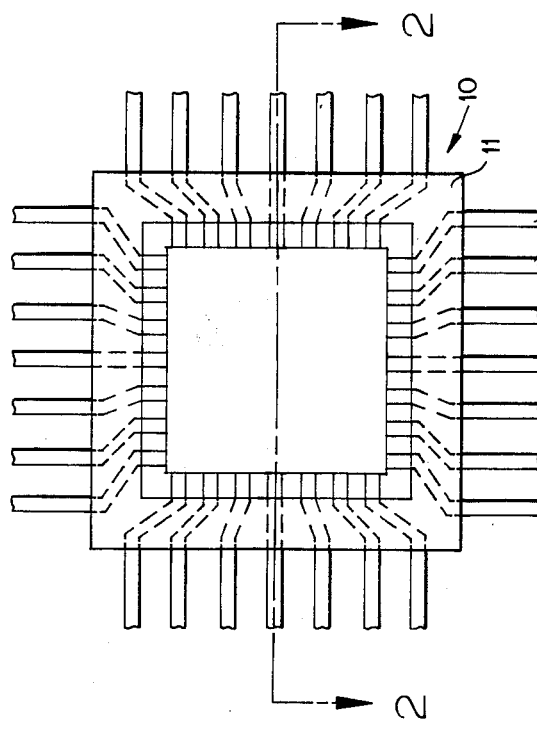
FIG. 1 is a top plan view of a hermetically sealable enclosure according to the invention.
Figure 3:
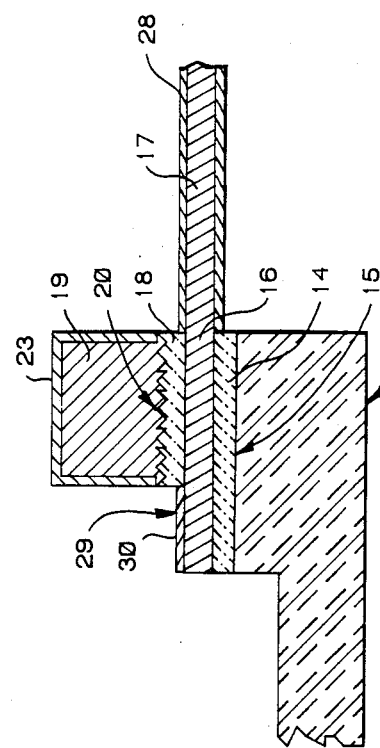
FIG. 3 is an enlarged cross-sectional view taken within line 3—3 of FIG. 2 and showing details of the invention.

As shown in FIG. 4, base member 11 can be of metallic material, is of substantially constant thickness in cross-section, and is formed with a substantially flat center portion 24 adapted to hold an electronic device, substantially flat margin portions 25 and vertically disposed connecting wall portions 26.

According to the method aspects of the invention, there is provided a method of fabricating a hermetically sealable enclosure 10 for an electronic device such as a micro-electronic circuit 13 which includes first the step of bonding the leadframe 16 to base member 11 by means of solder glass layer 14 between the leadframe and the upper surface 15 of base member 11. To leadframe 16 is bonded metallic ring 19 which may previously have been preplated with gold plating 23.

According to the method of the invention and particularly the preferred features, the upper surface 15 of base member 11 and the bottom surface 20 of metallic ring 19 are roughened prior to assembly. Roughening may be done by etching, sandblasting or photo-etching or other processes which will produce a geometrically configured pattern formed into the metal to provide physical or mechanical glass locks with the solder glass.

In a preferred method according to the invention, aluminum layers 21 and 22 may be applied on the bottom surface of metallic ring 19 and the upper surface 15 of base member 11. In a preferred form the aluminum layers are provided by known vacuum deposition methods.

Solder glass layers 14 and 18 are applied by melting solder glass to run into the roughened surface so that a mechanical lock is obtained.

As noted above, base member 11 can be of metal. The metallic base member can have a gold plating 27. The leads 17 of leadframe 16 can also have a gold plating 28 and the bonding pads 29 of the leadframe 16 can have an aluminum coating 30. The advantage of using a metallic, gold plated, base member is that the cross-sections of the base member can be thinner and the entire package can be of lighter weight.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description; and all changes which come within the meaning and range of equivalency of the claims are therefore intended to be embraced therein.

What is claimed is:

1. A hermetically sealable enclosure for an electronic device comprising:
    a. a base member having an area thereon adapted to hold an electronic device;
    b. a first layer of solder glass on the upper surface of said base member on a margin around said area;
    c. a lead frame positioned on and bonded to said base member by said solder glass;
    d. a second layer of solder glass bonded on the upper surface of said lead frame; and
    e. a metallic ring having a roughened bottom surface adapted to adhere to said second layer of solder glass, an upper surface of said metallic ring being adapted to have a cover for said package installed thereon.

2. A hermetically sealable enclosure according to claim 1 wherein said base member is metallic and the upper surface of said base member in contact with said first layer of solder glass is roughened.

3. A hermetically sealable enclosure according to claim 1 further comprising an aluminum layer between said metallic ring and said second layer of solder glass.

4. A hermetically sealable enclosure according to claim 1 further comprising an aluminum layer between said base member and said first layer of solder glass.

5. A hermetically sealable enclosure according to claim 1 wherein the upper surface of said base member in contact with said first layer of solder glass is roughened and further comprising layers of aluminum between said first and second solder glass layers and said roughened surfaces.

6. The method of fabricating a hermetically sealable enclosure for an electronic device comprising:
    a. bonding a lead frame to a base member by means of a solder glass layer between said lead frame and said base member, said base member having an area thereon adapted to hold an electronic device.
    b. providing a metallic ring having a bottom surface adapted to be bonded to said lead frame;

c. providing a roughened area on the surface of the metallic ring to be bonded to said lead frame; and, d. bonding said metallic ring to said lead frame by means of a solder glass layer between said metallic ring and said lead frame.

7. The method according to claim 6 further comprising the step of roughening the surface of said base member to be bonded to said solder glass.

8. A method according to claim 7 further comprising the step of applying an aluminum layer to the surface of said base member to be bonded to said solder glass prior to bonding of said lead frame to said base member.

9. The method according to claim 6 further comprising the step of applying an aluminum coating to the bottom surface of said metallic ring prior to bonding said ring to said lead frame.

10. The method according to claim 6 further comprising the step of applying an aluminum layer to the surface of said base member to be bonded to said solder glass prior to bonding of said lead frame to said base member.

* * * * *